United States Patent
Granger et al.

(10) Patent No.: US 11,950,064 B2
(45) Date of Patent: Apr. 2, 2024

(54) METHOD FOR AUDIO RENDERING BY AN APPARATUS

(71) Applicant: STEELSERIES FRANCE, Villeneuve d'Ascq (FR)

(72) Inventors: Damien Granger, Lille (FR); Nathan Souviraa-Labastie, Mons en Baroeul (FR); Antoine Deleplanque, Lille (FR)

(73) Assignee: STEELSERIES FRANCE, Villeneuve d'Ascq (FR)

( * ) Notice: Subject to any disclaimer, the term of this patent is extended or adjusted under 35 U.S.C. 154(b) by 173 days.

(21) Appl. No.: 17/784,766

(22) PCT Filed: Dec. 17, 2020

(86) PCT No.: PCT/EP2020/086669
§ 371 (c)(1),
(2) Date: Jun. 13, 2022

(87) PCT Pub. No.: WO2021/122914
PCT Pub. Date: Jun. 24, 2021

(65) Prior Publication Data
US 2023/0007394 A1 Jan. 5, 2023

(30) Foreign Application Priority Data
Dec. 19, 2019 (EP) .................................... 19306698

(51) Int. Cl.
*H04R 3/04* (2006.01)
(52) U.S. Cl.
CPC .................................... *H04R 3/04* (2013.01)
(58) Field of Classification Search
CPC .. H04R 3/04; H04R 2430/03; H04R 2499/11; H03G 9/025; H03G 9/18
(Continued)

(56) References Cited

U.S. PATENT DOCUMENTS 5,832,444 A * 11/1998 Schmidt ................ G10L 19/265
704/503
8,170,230 B1 * 5/2012 Ramirez ................ H04S 1/007
381/119
(Continued)

OTHER PUBLICATIONS

European Search Report in related, co-pending EP Application No. 19 30 6698, dated Jun. 16, 2020.
(Continued)

*Primary Examiner* — Xu Mei
(74) *Attorney, Agent, or Firm* — Thomas | Horstemeyer, LLP

(57) ABSTRACT

A method for audio rendering by an apparatus comprising at least one audio rendering device, the method comprising: extracting (S10) a plurality of frequency band components from an input audio signal; determining (S15) from the device frequency response and the plurality of extracted frequency band components at least one indicator representative of masking frequencies energy, masking frequencies corresponding to frequency bands that are above a frequency threshold; determining at least one correction factor (S16) from the indicator representative of masking frequencies energy; e) for each frequency band, determining a second acoustic level threshold (S20) by modifying (S17) with the correction factor a predetermined first acoustic level threshold associated with said frequency band, and determining a reduction gain from a comparison (S30) between an acoustic level of the extracted frequency band and the second acoustic level threshold associated to said extracted frequency band, and applying (S40) the reduction gain.

16 Claims, 7 Drawing Sheets

(58) Field of Classification Search
USPC .................................................. 381/73.1, 98
See application file for complete search history.

(56) References Cited

U.S. PATENT DOCUMENTS

| | | | |
|---|---|---|---|
| 8,218,783 B2* | 7/2012 | Katzer | H04K 3/224 381/73.1 |
| 10,225,654 B1* | 3/2019 | Lindemann | H04R 3/007 |
| 2009/0190772 A1* | 7/2009 | Osada | H04R 3/04 381/73.1 |
| 2013/0013096 A1 | 1/2013 | Seefeldt | |
| 2013/0046546 A1* | 2/2013 | Uhle | G10L 21/0364 704/500 |
| 2013/0142360 A1* | 6/2013 | Potard | H03G 3/20 381/98 |
| 2015/0194144 A1* | 7/2015 | Park | H04K 3/41 381/73.1 |
| 2015/0304775 A1* | 10/2015 | Fujita | H04R 3/04 381/94.2 |
| 2016/0072467 A1 | 3/2016 | Seefeldt | |
| 2017/0011748 A1* | 1/2017 | Porter | H04R 29/001 |
| 2019/0075395 A1 | 3/2019 | Lindemann et al. | |

OTHER PUBLICATIONS

International Search Report in related PCT Application No. PCT/EP2020/086669, dated Feb. 17, 2021.

* cited by examiner

METHOD FOR AUDIO RENDERING BY AN APPARATUS

CROSS REFERENCE TO RELATED APPLICATIONS

This application is the 35 U.S.C. § 371 national stage application of PCT Application No. PCT/EP2020/086669, filed Dec. 17, 2020, which application claims the benefit of French Application No. EP 19306698.2 filed Dec. 19, 2019, both of which are hereby incorporated by reference herein in their entireties.

The invention relates to a method for audio rendering by an apparatus comprising at least one audio rendering device.

An audio rendering device is a device that receives audio data and plays sounds corresponding to the received audio data. Typically, an audio rendering device is a loudspeaker, i.e. an electroacoustic transducer which converts an electrical audio signal into a corresponding sound.

Many modern electronic apparatuses are provided with embedded loudspeakers to allow the user to listen to many types of contents. For example, the apparatus can be a laptop computer, a tablet computer, or a smartphone. In order to minimize the size of such apparatuses, the manufacturers usually choose small loudspeakers, which leads to low loudness. The manufacturers have tried to design the loudspeaker-containing boxes and to implement other acoustic optimizations to make use of resonance phenomena in order to improve the acoustic levels of the low frequencies, but it is not sufficient. In addition, higher frequencies acoustic levels are too often insufficient. This results in a low loudness and a bad balance of the sound.

The low loudness of embedded loudspeakers is often compensated using amplifiers. It often leads to the loudspeakers being over-stressed, resulting in artefacts such as distortion or buzzing in the rendered sound. Through the use of several effects such as equalization, compressor, or limiter, it is possible to improve the loudness and balance of the rendered sound, while limiting the constraints on the loudspeakers. These effects can be implemented in hardware, for example with so-called smart amplifiers, or in software, with a processing method. Additionally, the smart amplifiers monitor the loudspeakers excursion and the loudspeakers temperature, to adapt the amplification gain and so avoid over-stress.

In addition, the loudspeakers are often ill-insulated from the other components such as the keyboard keys that can vibrate when audio content is played on the loudspeakers. These vibrations are audible and deteriorate the overall perception of the sound quality by the listener, even with good loudness and balance. The smart amplifiers do not take into account the environment of the loudspeakers; they are meant to only address the loudspeakers' over-stress, loudness and balance, and therefore do not help reducing this kind of sound deterioration.

The vibrations are generally due to a limited list of excitation frequencies (e.g. 349 Hz, 740 Hz) of the audio content. A simple treatment consists in imposing a fixed reduction gain to the acoustic level of a frequency band encompassing the problematic frequencies, for example by applying a notch filter or a band cutter (with a very narrow band). This approach however may deteriorate the quality of the sound perceived by the listener.

U.S. Pat. No. 9,762,198 describes a method for dynamically adjusting thresholds of a compressor. An input audio signal having a number of frequency band components is processed. Time-varying thresholds can be determined. A compressor performs, on each frequency band component, a compression operation having a corresponding time-varying threshold to produce gains. Each gain is applied to a delayed corresponding frequency band component to produce processed band components, which are summed to produce an output signal. In some implementations, a time-varying estimate of a perceived spectrum of the output signal and a time-varying estimate of a distortion spectrum induced by the perceived spectrum estimate are determined, for example, using a distortion audibility model based on generation of harmonics. This model can be obtained through measure made beforehand on the device. However, this approach does not accurately reflect the behavior of each loudspeaker. There are too many variations between samples of the same model, and also between two measures made on the same device. The model can also be estimated more simply through an offset, but this result in too much approximation. Also, the audibility of the distortion is calculated through an estimate of a psycho-acoustic mask. Furthermore, such a computation is very resource-demanding, and therefore requires approximations to alleviate the computation. This result is therefore very deteriorated. In addition, the frequency bands on which the gains are applied are the same as those used for the threshold. Yet, the frequency bands can contain a variety of different sounds, and the reduction results in a noticeable effect on the tone of the audio content.

Patent application US2019/075395 describes a method wherein a spectral tilt of an audio signal is used to determine whether a speaker will introduce perceptible distortion during playback of the audio signal. Spectral tilt refers to how energy is distributed across the spectrum in the audio signal. The spectral tilt may be indicated by determining a ratio between energy in a distortion-producing frequency band and energy in a distortion-masking frequency band. Based on the determined spectral tilt, the distortion-producing frequency band may be attenuated to reduce the distortion introduced by the speaker. More specifically, the signal level is attenuated in an attenuation frequency band of the input audio signal to produce a modified audio signal based on a ratio between the signal level of a distortion-masking frequency band of the input audio signal and the signal level of the distortion-masking frequency band.

SUMMARY OF THE INVENTION

The invention proposes to make inaudible artefacts such as vibration, distortion or buzzing while maintaining the best possible loudness and balance, i.e. by minimizing the impact on the rendered sound. To do so, the method adapts the sound only when necessary, in a dynamical way that depends on the content of the sound.

To this end, the invention is a method for audio rendering by an apparatus comprising at least one audio rendering device, the method comprising:

a) receiving an input audio signal,
b) extracting a plurality of frequency band components from the input audio signal, each frequency band components having an acoustic level associated with a frequency band,
c) determining from the plurality of extracted frequency band components at least one indicator representative of masking frequencies energy, masking frequencies corresponding to frequency bands that are above a frequency threshold, the indicator representative of masking frequencies energy being determined only from frequency bands that are above the frequency threshold, d) determining at least one correction factor from said at least one indicator representative of masking frequencies energy, e) for each frequency band, determining a second acoustic level threshold by modifying with the correction factor a predetermined first acoustic level threshold associated with said frequency band, wherein the first acoustic level threshold is independent from the content of the input audio signal, said first acoustic level threshold indicating a highest acoustic level for that frequency band which can be played by the apparatus without significant artefacts, and wherein the second acoustic level thresholds depend on the input audio signal, f) for each frequency band, determining a reduction gain from a comparison between an acoustic level of the extracted frequency band component of said frequency band and the second acoustic level threshold associated with said extracted frequency band, and g) applying the reduction gain to the acoustic level of the frequency band components, h) converting the different frequency band components into an output audio signal i) audio rendering the output audio signal by the audio rendering device.

The method makes it possible to limit the use of vibration reduction when the context allows it. For example, the method will apply little or no reduction when it is not perceptually necessary, i.e. when the audio level of the context is sufficiently high compared to the estimated audio level of the vibrations and can thus mask it from a perceptual point of view. In this way, the audio content is less altered, with a higher audio rendering fidelity.

Other preferred, although non limitative, aspects of the method of the invention are as follows, isolated or in a technically feasible combination:

the audio rendering device has a predetermined device frequency response, and the indicator representative of masking frequencies energy is also determined from the device frequency response;

the frequency threshold is higher or equal to 6 kHz, preferably higher or equal to 8 kHz, and more preferably higher or equal to 10 kHz;

a plurality of indicators representative of masking frequencies energy are determined, the indicators representative of masking frequencies energy being determined from frequency bands corresponding to different subranges of frequencies defined by different frequency thresholds;

several correction factors are determined from the plurality of indicators representative of masking frequencies energy, and different correction factors are used to determine second acoustic level thresholds of different frequency bands, the correction factor that is used depending on the frequency band;

at least one frequency band is associated several indicators representative of masking frequencies energy, and the correction factor used to determine the second acoustic level threshold associated with said frequency band is determined from at least one of the several indicators representative of masking frequencies energy associated with said frequency band;

a correction factor is determined from each indicator representative of masking frequencies energy, resulting in a plurality of correction factors associated with frequency bands of said subrange of frequencies;

the second acoustic level threshold is determined by using a selected correction factor which is selected among a plurality of correction factors associated with at least one frequency band associated with said the second acoustic level, the selected correction factor being selected for resulting in a lowest second acoustic level threshold among second acoustic level thresholds that would be determined by using the plurality of correction factors;

two subranges of frequencies have a common frequency band, resulting in two indicators representative of masking frequencies being associated to the common frequency band, either one indicator of the two indicators representative of masking frequencies that is not the selected indicator is set to zero or the first acoustic level threshold is not modified;

the frequency band components are extracted as frequency band signal components, and the acoustic level of a frequency band signal component is an amplitude of the frequency band signal component, or the frequency band components are extracted as frequency band bin components, and each frequency band is a frequency bin, and wherein step b) comprises converting the input audio signal into frequency band bin components in a frequency domain, wherein the acoustic level of a frequency band bin component is a magnitude of a frequency band bin component, and wherein step h) comprises converting frequency band bin components into a time domain;

the indicator representative of masking frequencies energy determined in step c) is a function of a sum of acoustic levels of frequency band components that are above the frequency threshold;

the indicator representative of masking frequencies energy determined in step c) is a function of statistical property of the spectrum such as the variance;

the higher the masking frequencies energy in the input audio signal is, the lower the correction factor is, and conversely the lower the masking frequencies energy in the input audio signal is, the higher the correction factor is;

the correction factor is limited by boundaries that are independent from the content of the input audio signal;

each first acoustic level threshold is comprised between 0 and −60 dB;

the first acoustic level thresholds result from an automatic calibration process or a manual calibration process before receiving the input audio signal;

the input audio signal is a multi-channel input audio signal, each channel associated with an audio rendering device, and at least the steps b) to e) are performed independently for each channel;

the frequency band components are extracted as frequency band bin components, and each frequency band is a frequency bin, and wherein step g) comprises:

g1) for each frequency band, determining a preliminary gain from a comparison between an acoustic level of the extracted frequency band component of said frequency band and the second acoustic level threshold associated with said frequency band, g2) detecting a plurality of local minima over acoustic levels of frequencies in the frequency band components, g3) grouping together frequency bands located between two local minima to form a plurality of frequency groupings, g4) for each grouping, determining a reduction gain of the grouping corresponding to a lowest preliminary gain among the preliminary gains of the frequency bands of said grouping, g5) affecting the reduction gain of the grouping to each one frequency bands of said grouping;

a microphone records a microphone signal in the vicinity of the apparatus when the output audio signal is rendered by the audio rendering device, and the microphone signal is used to modify the indicator as a function of a part of the microphone signal corresponding to ambient sound in the vicinity of the apparatus.

According to another aspect, there is provided an apparatus comprising at least one audio rendering device and a processing unit, the apparatus being configured to perform the steps of the method according to the invention.

According to another aspect, there is provided a non-transitory computer-readable medium comprising program instructions stored thereon that cause the computer to perform the steps of the method according to the invention when read by a computer

BRIEF DESCRIPTION OF THE DRAWINGS

Other aspects, objects and advantages of the present invention will become better apparent upon reading the following detailed description of preferred embodiments thereof, given as non-limiting examples, and made with reference to the appended drawings wherein.

DETAILED DESCRIPTION OF THE INVENTION

The method is performed by an apparatus comprising at least one audio rendering device and a processing unit. The apparatus can for example be a computer, a laptop or tablet computer, a smartphone, a sound system constituted of several physical elements connected together, or any other type of similar device. An audio rendering device is for example a loudspeaker, or a similar device that can generate audible sounds.

Figure 1:
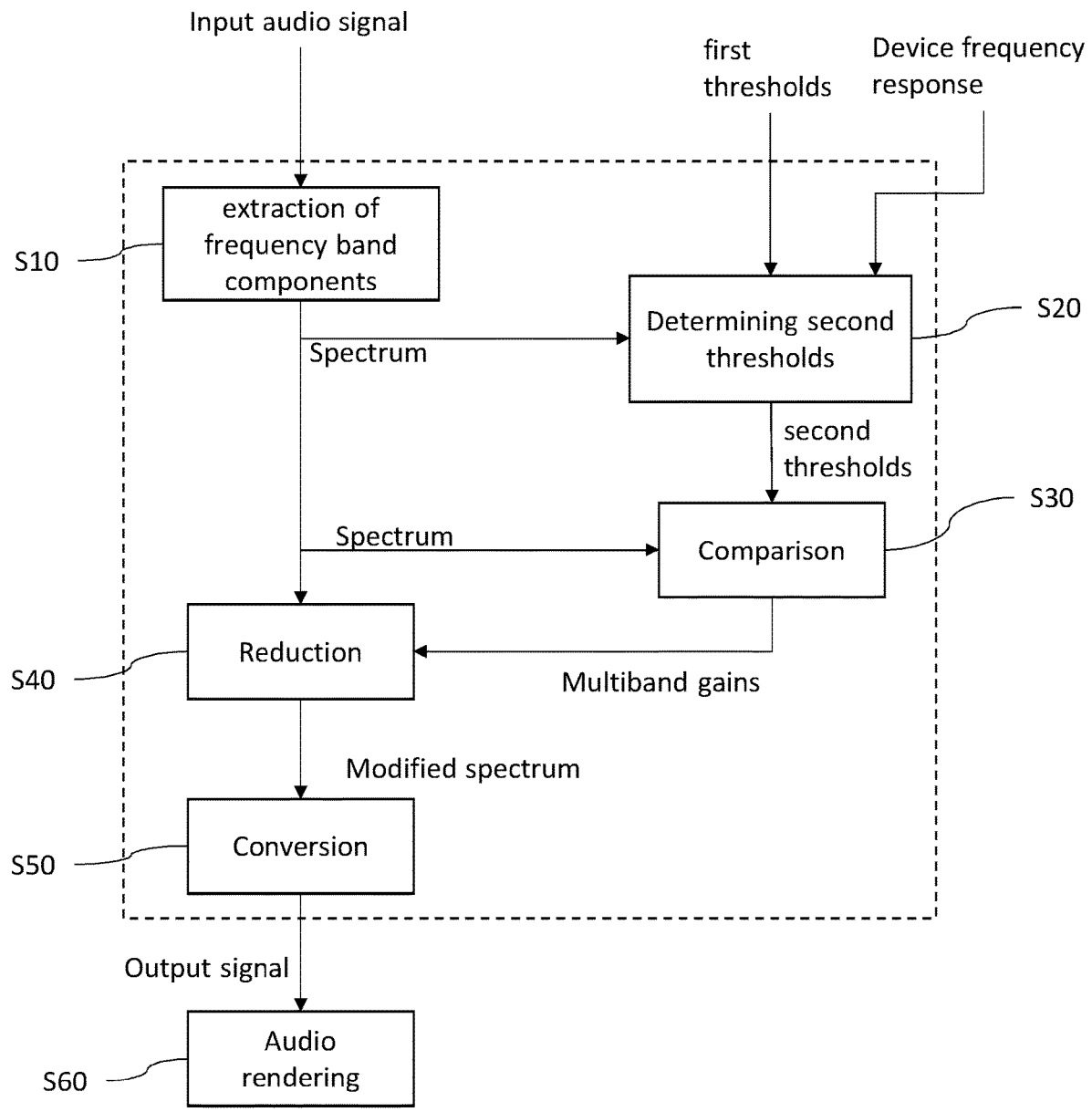
FIG. 1 is a schematic diagram showing steps of the method according to a possible embodiment.
Figure 2:
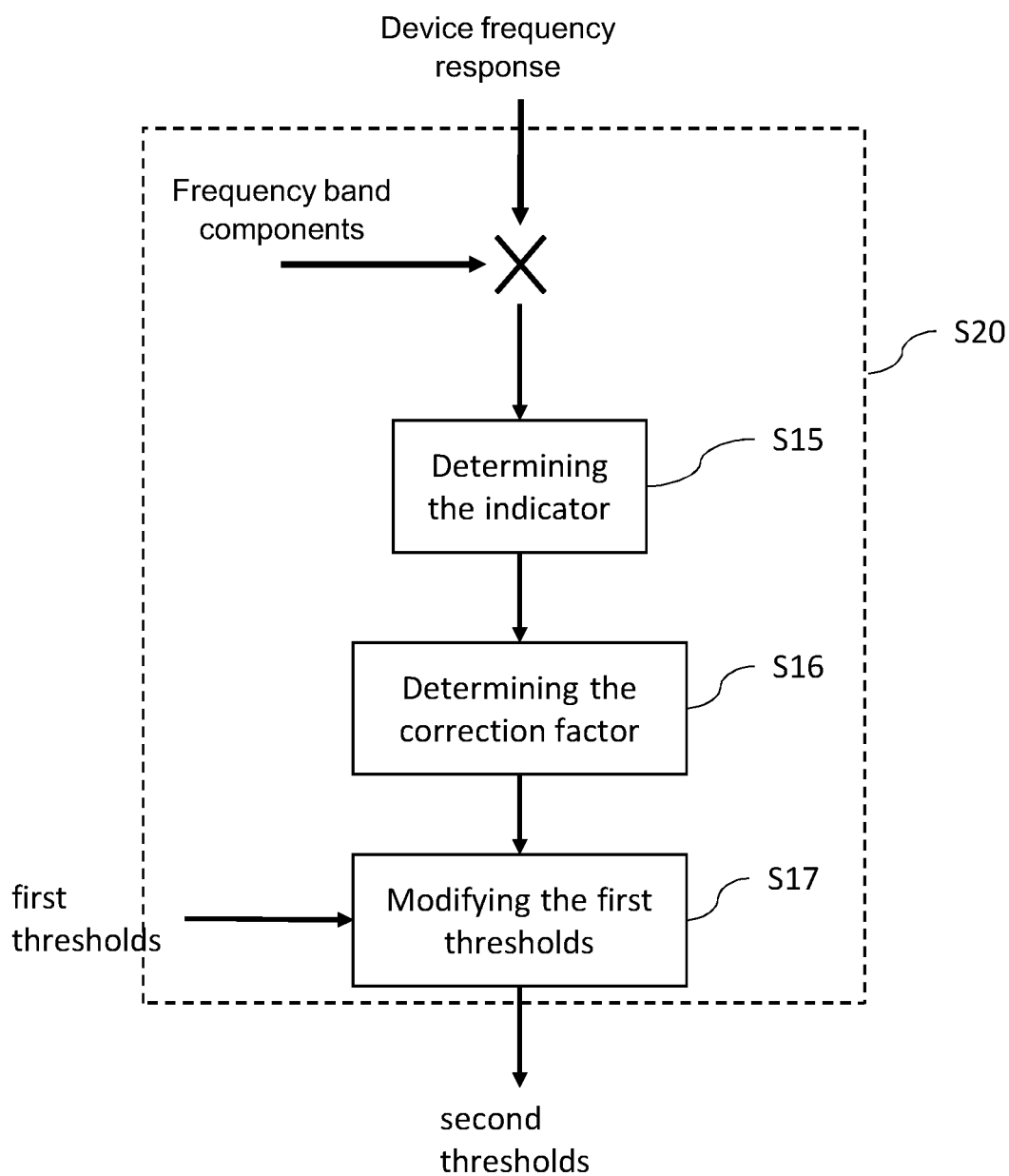
FIG. 2 is a schematic diagram showing a detailed view of a step of the method according to a possible embodiment.

In reference to FIG. 1, an input audio signal is first received. The input audio signal may have any type of audio content (music, songs, voices, etc.) and may have various origins (digital audio such as MP3, audio CD, videogame, movie DVD, internet, etc.). The content of the input audio signal is intended to be rendered (i.e. played) to a user by an audio rendering device such as a loudspeaker. The input audio signal may be a multi-channel input audio signal, each channel of the multi-channel input audio signal being assigned to an audio rendering device such as a loudspeaker.

An input audio signal is constituted of data (typically series of binary numbers for digital signals) that varies over time. The data variations define the audio content of the input audio signal. The data variations occur in accordance with various frequencies that can be grouped into frequency bands. It is therefore possible to extract a plurality of frequency band components from the input audio signal (step S10). Each frequency band component has an acoustic level associated with a frequency band.

The method can be carried out in the time domain. In this case, the frequency band components are extracted as frequency band signal components, and the acoustic level of a frequency band signal component is an amplitude of the frequency band signal component, which here designates the short-time energy on each frequency band. The frequency band signal components can be extracted by using a filter bank, i.e. an array of band-pass filters that separates the input audio signal into multiple frequency band signal components, each one carrying a single frequency sub-band of the original input audio signal with an amplitude corresponding to the acoustic level of the input audio signal in that particular frequency sub-band.

The method can be carried out in the frequency domain. In this case, the frequency band components are extracted as frequency band bin components, and each frequency band is a frequency bin. To extract the frequency band bin components, the method comprises converting the input audio signal into frequency band bin components in the frequency domain, and the acoustic level of a frequency band component is a magnitude of a frequency band bin component. Working in the frequency domain allows a good compromise between computing time and accuracy, and therefore constitutes the preferred embodiment. In a non-limiting way, the following description will be done in relation with a method carried out in the frequency domain, but any teaching of the description may apply to a method carried out in the time domain.

A number of different mathematical transforms can be used to extract frequency band bin components from a time-domain signal such as the input audio signal. One of the most efficient and commonly used transform is the fast Fourier transform (FFT). In a preferred embodiment, a variant called the short-time Fourier transform (STFT) is used, wherein the FFT is carried on successive segments of the input audio signal. The subsequent steps of the method are then carried out on each segment, successively stored in a buffer. Optionally but preferably, several additional processes can be carried out to improve the result of the method.

Applying the processing completely separately on two successive segments of the input audio signal may result in steep variation between the two segments in the output audio signal that is sent to the audio rendering device. Such steep variation may lead to audible artefacts, such as distortion, which may deteriorate the audio quality. In order to mitigate this drawback of the segmentation, a technique of overlap-add can be implemented, wherein each buffered segment (index n) of the input audio signal is processed two times: a first time with the directly previous buffered segment (index n−1) and a second time with the directly subsequent buffered segment (index n+1). To simplify the following description, the buffer index will be used to refer indifferently to the buffered segment as well as the buffer resulting from the overlap-add technique.

The magnitudes of the frequency band bin components obtained after extraction are preferably normalized to remove any bias of the extraction. Indeed, many fast Fourier transform functions present in commonly used library may introduce bias, in particular since the transform is applied on a short (e.g. 1024 samples) segment of an audio signal.

The normalization may also be used to adapt the magnitudes of the frequency band bin components to the volume setting of the loudspeaker. Indeed, the method mainly aims at reducing audible vibration resulting from the loudspeakers playing the sound. The vibration induces by a loudspeaker depends heavily on the loudness of the sound which is played by the loudspeaker. Since the loudness of a played sound depends as much from the audio content as from the settings of the apparatus, taking account the volume setting allows to more accurately estimate the likeliness of the vibration problem. On many apparatuses such as computers, volume adjustment is applied after the audio processing. As a result, the volume setting does not appear in the input audio signal. Using the volume setting in a normalisation process thus allow to anticipate the effects of the volume setting on the sound quality.

The normalization of the magnitude of the frequency band bin components may follow a formula such as:

$$|\tilde{S}(n,k,c)| = |S(n,k,c)| * Coeff * Volume$$

where |S(n, k, c)| is the magnitude of the frequency band bin components defined by the buffer index n, the frequency bin k, and the channel c. Volume is a real number corresponding to the volume setting. Coeff is a normalization coefficient for compensating the bias, that depends on the software library of functions that is used for the transform (for example the library of Integrated Performance Primitives, IPP, of Intel). The normalization coefficient Coeff also depends on the analysis window. The coefficient Coeff can for example follow a formula such as:

$$Coeff = \frac{\alpha}{W}$$

with α a real number, and W a real number that depends on the size of the analysis window. α, and W can be determined by taking a sine wave of 750 Hz and 0 dB full scale as the input audio signal, and constraining to 1 the value of the magnitude of the frequency bin corresponding to 750 Hz.

Other techniques for improving the extraction of the frequency band components can also be used. For example, zero padding can be used before converting the converting the input audio signal into the frequency domain. The signal data in the analysis window are completed with zeros in order to artificially increase the frequential resolution of the conversion into the frequency domain.

Indicator Representative of Masking Frequencies Energy

Once the frequency band components have been extracted from the input audio signal, at least one indicator representative of masking frequencies energy is determined. The indicator is determined from the device frequency response and the plurality of extracted band components. The masking frequencies correspond to the frequencies that are above a frequency threshold and therefore capable of masking vibrations occurring above the frequency threshold. The indicator is determined by using only frequency bands that are above the frequency threshold. This means that the acoustic levels of the frequency band components that are below the frequency threshold are not used for determining the indicator representative of masking frequencies energy. The frequency threshold separates the frequency range between two subranges: a first subrange of frequencies that are below the frequency threshold, that can cause the vibrations, and a second subrange of frequencies that are above the frequency threshold and can mask or conceal the vibrations caused by frequencies of the first subrange of frequencies. The value of the frequency threshold therefore depends on the apparatus' configuration (environment of the loudspeaker, etc.) and on the loudspeaker's property (frequency range of the loudspeaker, etc.). In most cases, the frequency threshold is preferably superior to 6 kHz, preferably superior to 8 kHz, and more preferably superior to 10 kHz. For the sake of illustration, in a non-limitative way the description will be done in reference to masking frequencies corresponding to rather high frequencies, above 6 kHz. It shall be noted that all the frequency bands that are above the frequency threshold are not necessarily used to determine an indicator representative of masking frequencies energy. For example, an indicator can be determined from the frequency bands above a frequency threshold of 8 kHz, but below 14 kHz. Preferably, an indicator representative of masking frequencies energy is determined from frequency bands ranging over at least 4 kHz above the frequency threshold, and more preferably ranging over at least 6 kHz above the frequency threshold (for example 12-20 kHz or 10-16 kHz).

The parasitic vibrations created by the loudspeakers result in harmonics on the whole audible range (e.g. 10 Hz to 20 kHz), but particularly present in high frequencies, i.e. beyond 6 or 8 kHz. While low-frequency harmonics are present in most usual sounds (music, human voice, etc.), high-frequency harmonics are often not contained in usual sounds. As a consequence, parasitic high-frequency harmonics are much more noticeable than parasitic low-frequency harmonics. Even though such parasitic high-frequency harmonics show much lower acoustic level than their fundamental frequency (typically at least 60 dB lower), they remain highly audible because they are not acoustically concealed by the fundamental or the first harmonics. In addition, when a component of the apparatus vibrates (and particularly when it contacts other components), inter-harmonic noise appears. Such an inter-harmonic noise is all the more noticeable that it results in non-natural sounds.

It was noticed that some music tunes were more prone than others to the appearance of audible parasitic sounds resulting from vibrations. For example, playing classical music with an apparatus may lead to audible vibrations being heard, while vibrations were not noticeable when playing pop-music with the same apparatus.

Figure 3:
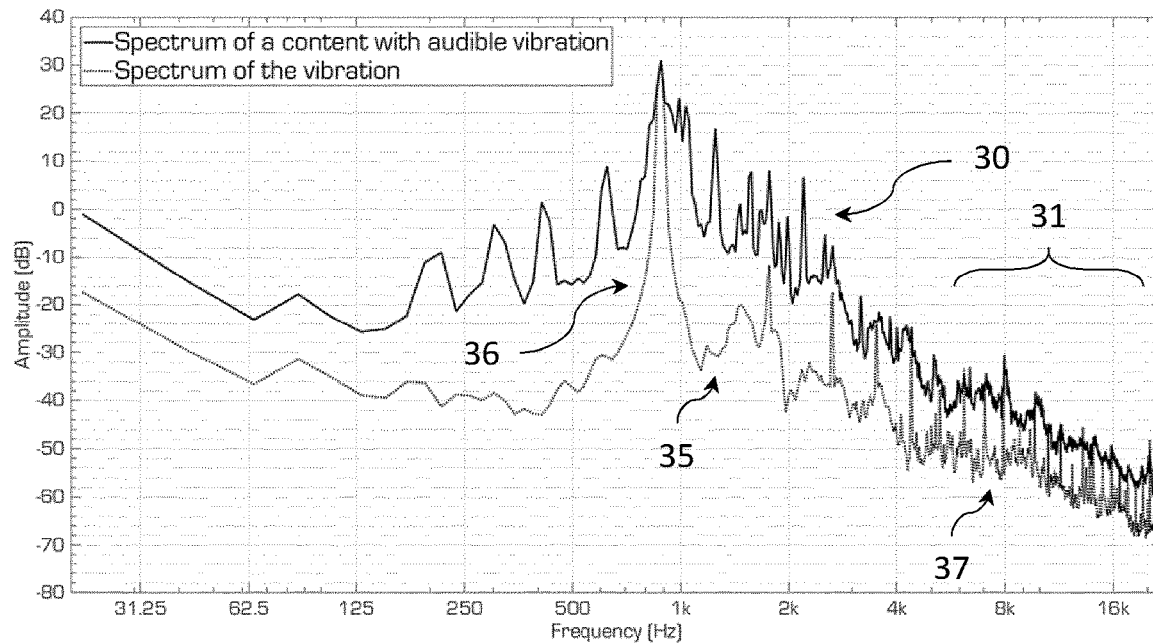
FIG. 3 shows a spectrum of a first played audio content with audible vibration when a vibrating frequency is played.
Figure 4:
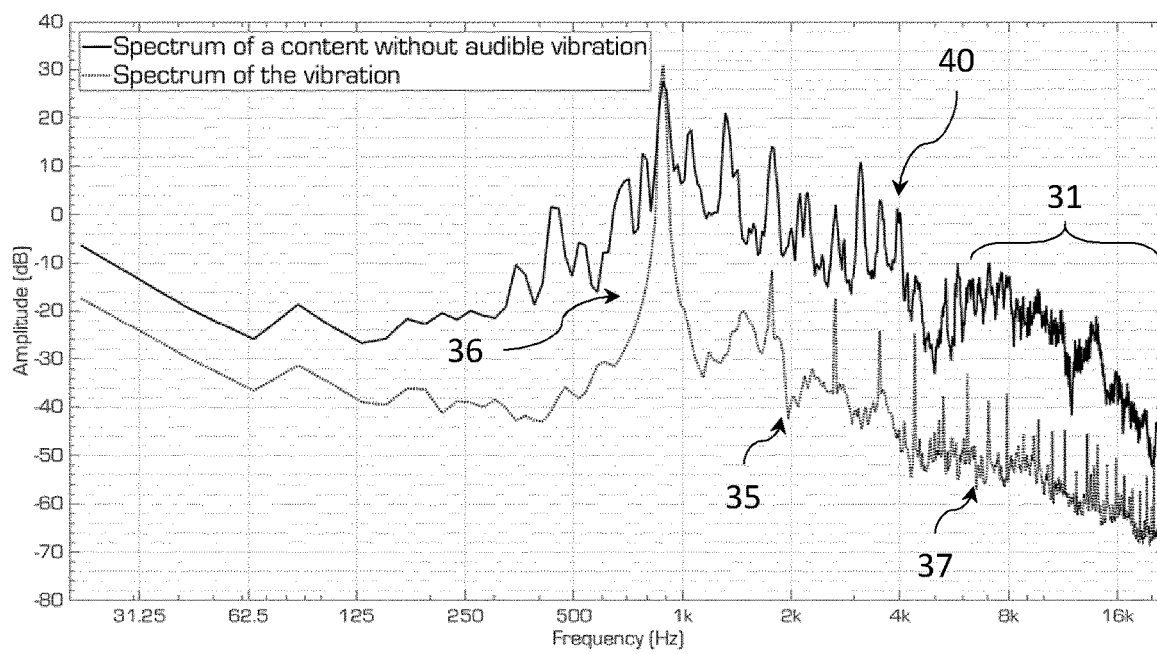
FIG. 4 shows a spectrum of a second played audio content without audible vibration when a vibrating frequency is played.

FIGS. 3 and 4 illustrate the influence of the audio content on vibration generation. FIG. 3 shows a frequency spectrum 30 of a recorded first played audio content with audible vibration when a vibrating frequency is played, and FIG. 4 shows a frequency spectrum 40 of a recorded second played audio content without audible vibration when the same vibrating frequency is played at the same acoustic level. The first played audio content is a piece of classical music, prone to vibration artefacts, and the second played audio content is a piece of pop-music. The two audio contents are played by the same loudspeakers of the same laptop computer, recorded with the same microphone. FIGS. 3 and 4 also show the frequency spectrum 35 of an exemplary pure sound at a vibrating frequency of 880 Hz, played and recorded alone with the same computer, with the same acoustic level as the played contents at the vibrating frequency of 880 Hz. As visible from the frequency spectrum 35 of the exemplary sound, audio content at the vibrating frequency generates vibrations that results in parasitic vibrations occurring at higher frequencies.

In FIG. 3, within the high frequencies 31 (here above 6 kHz), the spectrum 35 of the exemplary sound is very close to the spectrum 30 of the first played audio content. This means that the magnitudes of the high frequencies 31 of the spectrum 30 essentially result from the vibrations caused by the acoustic level at the vibrating frequency within the first played audio content. The first played audio content has low other magnitudes of its own for those high frequencies 31, and therefore the vibrations are not concealed within high frequencies 31. On the opposite, on FIG. 4, the magnitudes of the spectrum 35 of the exemplary sound stay lower than those of the spectrum 40 of the second played audio content. Even though vibrations are caused by the second played audio content at the vibrating frequency of 880 Hz, the vibrations are not audible because the second played audio content conceals the vibrations for the high frequencies 31. The high frequencies 31 therefore constitute masking frequencies.

Figure 5:
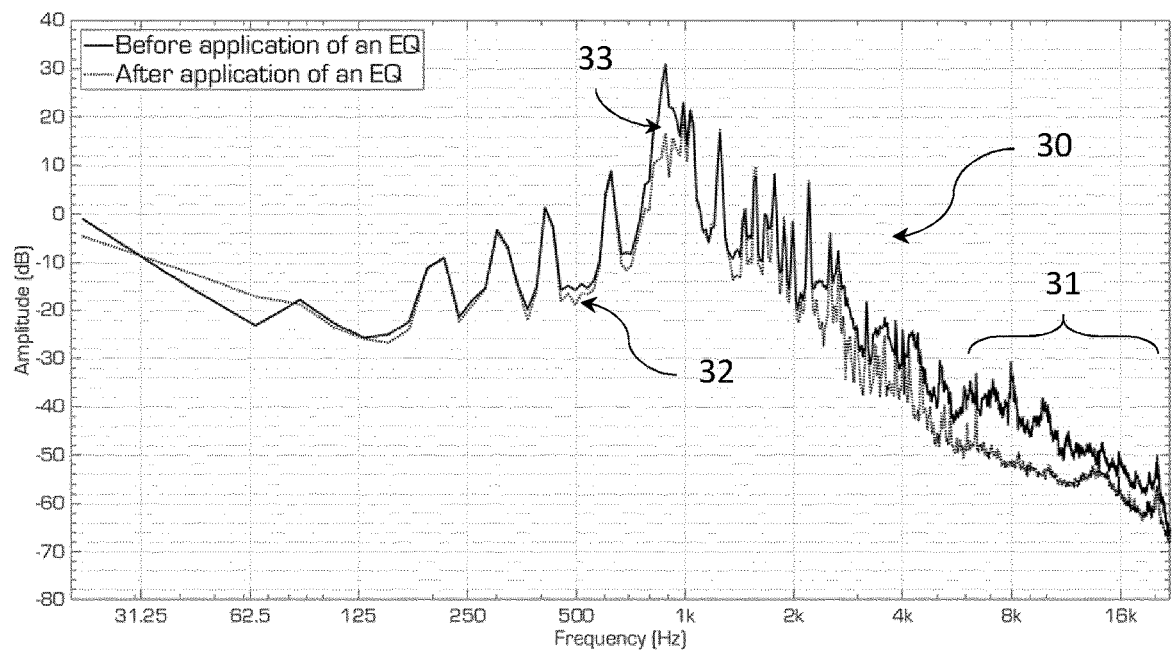
FIG. 5 shows a spectrum of the first played audio content before and after the application of the gain function according to a possible embodiment of the invention.
Figure 6:
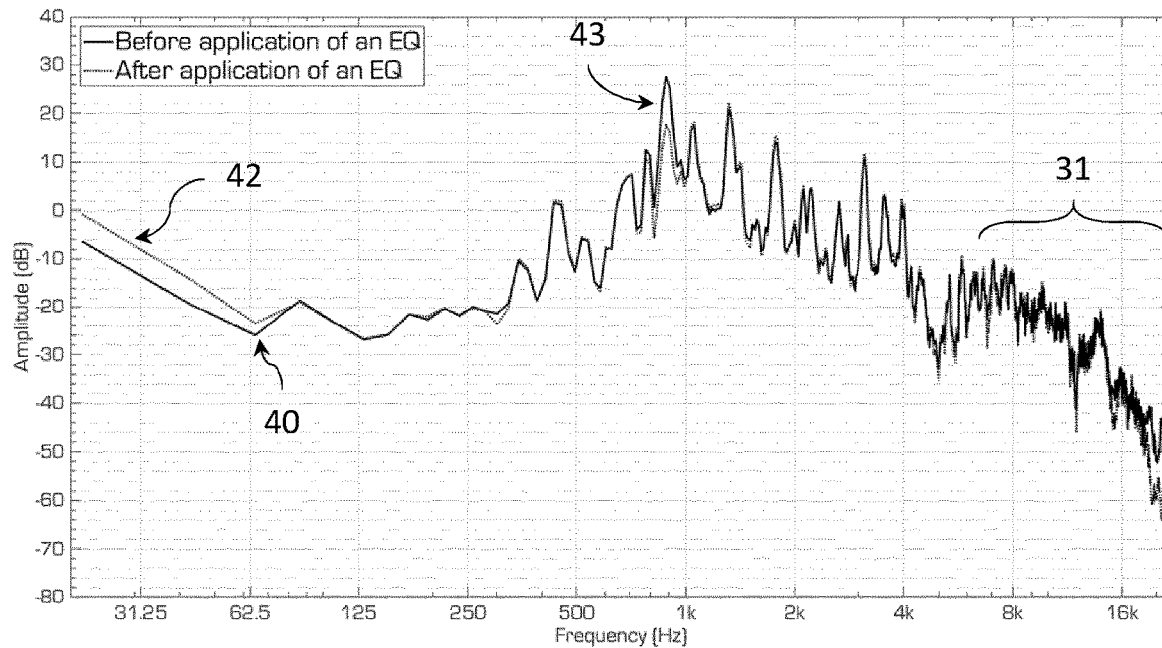
FIG. 6 shows a spectrum of the second played audio content before and after the application of the gain function according to a possible embodiment of the invention.

It is possible to reduce the impact of the vibrating frequency by reducing the magnitude of the played content for that vibrating frequency through the application of a gain function. On the examples of FIGS. 5 and 6, a gain of −12 dB is applied to the magnitude of the vibrating frequency (880 Hz) for both audio contents. FIG. 5 shows the spectrum 30 of the first played audio content as in FIG. 3, and the spectrum 32 of the first played audio content after the gain has been applied. As expected, the spectrum 32 shows a significant decrease of the magnitude within the higher frequencies 31 with respect to the original spectrum 30. Also, a listener can no longer perceived the parasitic noise resulting from the vibrations. FIG. 6 shows the spectrum 40 of the second played audio content as in FIG. 4, and the spectrum 42 of the second played audio content after the gain has been applied. Contrary to FIG. 5, there is no significant difference between the two spectra 40, 42, in particular for the high frequencies comprised between 6 kHz and 16 kHz. This is because the acoustic level at the high frequencies was not mainly due to the vibrations but instead was mainly due to the second played audio content. As before, parasitic noise resulting from the vibrations cannot be perceived by a listener.

In both cases, after application of the gain, the parasitic noise from vibration cannot be perceived. However, the gain applied at 880 Hz has modified the audio signal, the two spectra 32, 42 showing noticeable lower magnitudes 33, 43 at 880 Hz. As a result, the second played audio content has been substantially modified by the gain even though there was no need to do so: the parasitic noise was not perceivable, it was concealed by the high-frequency content.

Indeed, as demonstrated by FIGS. 3 and 4, the parasitic noise generated by the vibration is audible only when the played content that induces this vibration does have enough energy in a high frequency range to conceal the generated parasitic noise, and therefore to mask the vibrations. The idea is therefore to analyse the energy of the high-frequency band components, to determine whether or not a high-frequency parasitic noise would be concealed. If the high-frequency band components have enough energy to conceal the high-frequency parasitic noise, then there is no need to alter the audio signal since the high-frequency parasitic noise will not be perceivable. Conversely, if the high-frequency band components do not have enough energy to conceal the high-frequency parasitic noise, then a gain reduction must be applied to suppress the high-frequency parasitic noise that otherwise would be audible.

Estimating the energy contained in the high frequencies (i.e. that are above the frequency threshold) is a good way to assess the concealing capacity of the input audio signal. The higher the high-frequency energy, the more likely the vibration-induced noise will be concealed. The concealing capacity of the audio signal depends on two main aspects:
  energy in the high frequencies of the input audio signal to be played,
  energy in the high frequencies in the device frequency response of the loudspeakers.

The device frequency response of the audio rendering device is the quantitative measure of the output spectrum of said audio rendering device in response to a stimulus, and is used to characterize the dynamics of the audio rendering device. It is a measure of magnitude and phase of the output as a function of frequency, in comparison to the input. Estimating the frequency response for a physical system generally involves exciting the audio rendering device with an input signal, measuring both input and output time histories, and comparing the two through a process such as the Fast Fourier Transform (FFT). The device frequency response can thus be determined beforehand with a conventional technique such as a swept-sine technique or a pink noise with a filter bank.

The indicator representative of masking frequencies energy is preferably a function of a sum of acoustic levels of frequency band components that are above the frequency threshold. The indicator representative of masking frequencies energy can also be a function of a statistical property of the spectrum of the audio signal input such as the variance, hence representing the flatness of the spectrum. There are indeed many ways to build an indicator representative of masking frequencies energy. The description below presents the determination of such an indicator as a function of a sum of acoustic levels of frequency band components.

Preferably, the indicator takes into account what will be heard by the listeners, because it is the audio output of the loudspeakers that will conceal the audio artefacts. The exact spectrum of the audio output of the loudspeakers that will be heard by the listeners, is unknown beforehand, because it depends on both the input audio signal and the loudspeakers. For each frequency band, the spectrum of the audio output is estimated through a product between the device frequency response of the loudspeakers within a frequency band with the acoustic level of said frequency band:

$$S_{out}(n,k,c) = |\tilde{S}(n,k,c)| * FR(k,c)$$

with n the buffer index, k the frequency band index, c the channel index, and FR(k, c) the device frequency response of the apparatus for the frequency band k and the channel c. The device frequency response FR(k, c) is more precisely the acoustic level of the frequency response of the loudspeaker to which is sent the channel c.

Then the high-frequency energy $E_{HF}$ is estimated from the sum of the square of the estimate of the audio output $S_{out}$ for the high frequencies:

$$E_{HF}(n, c) = 10 * \log_{10}\left(\frac{1}{k_{max} - k_{min} + 1} * \sum_{k=k_{min}}^{k=k_{max}} (|S(n, k, c)| * FR(k, c))^2\right)$$

with n the buffer index, k the frequency band index, c the channel index, $k_{min}$ the lower index of the high-frequency bands and $k_{max}$ the higher index of the high-frequency bands considered for determining the indicator.

The indicator Indic then corresponds to the mean value among the channels c, with C the total number of channels:

$$Indic(n) = \frac{1}{C} * \sum_{d=1}^{C} E_{HF}(n, c)$$

If there is only one channel c, then the indicator Indic is the high-frequency energy estimate $E_{HF}$.

The frequency corresponding to the higher index $k_{max}$ of the high-frequency bands can roughly defined by the higher limit of the human audible range, and can for example be chosen between 16 kHz and 20 kHz. The frequency corresponding to the higher index $k_{max}$ of the high-frequency bands can also be lower to better define the frequency range where the vibrations are to be considered. For instance, if an exciting frequency at 800 Hz produces vibrations below 12 kHz, the higher index $k_{max}$ can be chosen to correspond to the frequency band at 12 kHz.

The lower index $k_{min}$ of the high-frequency bands corresponds to the lower frequency threshold defining the frequencies that are used for determining the high-frequency energy indicator. As explained above, this frequency threshold is preferably superior to 6 kHz, 8 kHz, and preferably superior to 10 kHz or higher. The value of the frequency threshold is chosen in consideration with the following points:
- the vibrations result in high-order harmonics whose frequencies are often higher than several kilohertz;
- in general, there is no important decrease in the device frequency response of computer loudspeakers or similar audio rendering devices below 10 kHz;
- most audio contents have energy below 10 kHz, and therefore most distortions or vibration sounds below 10 kHz will be concealed;
- if the audio content has no energy between 6 kHz and 10 kHz, energy above 10 kHz is very unlikely.

It is possible to take ambient sound into consideration for determining the indicator representative of masking frequencies energy by using a microphone signal generated by a microphone recording the sound in the vicinity of the apparatus. The content of the microphone signal will of course result from the output audio signal rendered by the audio rendering device, originating from the input audio signal. Part of the content of the microphone signal will however also be independent from the output audio signal, and will then correspond to ambient sound. This other part can be isolated through processing such as using an acoustic echo canceller. A filter such as a median filter can also be used to improve the isolation of the ambient sound. If the microphone signal shows that the ambient sound contains enough high-frequency energy to conceal the vibration-induced artefacts, it is possible to modify the indicator representative of masking frequencies energy to reflect that. Accordingly, if the part of the microphone signal that corresponds to ambient sound has enough high-frequency energy (e.g. above a frequency threshold similar to the one used for the indicator), an additional term can be added to the indicator to increase its value. Conversely, it is also possible to lower the indicator if the part of the microphone signal that corresponds to ambient sound has a low high-frequency energy.

Correction Factor

From the indicator Indic, a correction factor is then determined (step S16). The correction factor is meant to modify a correction threshold determining how the acoustic level of each frequency band must be corrected. The correction factor can be applied to a threshold by multiplying said threshold, or can be applied as an exponent to the threshold. Preferably, the correction factor is defined to reach a value of 1 or higher for input audio signals considered as prone to be affected by audible vibration sounds, and to be below 1 for input audio signals considered as unlikely to be affected by audible vibration sounds.

The correction factor may thus correspond to the indicator Indic, however weighted and restricted with boundaries. For example, the correction factor may be defined as a linear function of the indicator:

Factor($n$)=$a$×Indic($n$)+$b$ with a and b two real numbers. The correction factor should have a trend opposed to the trend of the indicator: the higher the indicator, the lower the correction factor, and vice-versa. The correction factor preferably decreases with the high frequency energy in the input audio signal, i.e. with the masking frequencies energy. As a result, if the indicator preferably increases with the high frequency energy, and the number a is thus preferably negative. The correction factor is thus a function of the opposite of the indicator representative of masking frequencies energy, i.e. of the additive inverse of the indicator.

The numbers a and b are fixed and previously determined, for example by taking at least two input audio signals with two different audio contents: at least one with a lower high-frequency energy (as the one illustrated in FIG. 3) and at least another one with an higher high-frequency energy (as the one illustrated in FIG. 4). The values of a and b are searched so that the correction factor is higher than 1 with a problematic content (i.e. prone to vibration artefacts) corresponding to the audio content with a lower high-frequency energy, and the correction factor is lower than 0.8 with a non-problematic content corresponding to the audio content with a higher high-frequency energy. A linear regression can be used to determine the values of a and b. In addition, the value of b can be further modified to preserve the tone of the audio content while keeping the vibrations small.

Typically, a is between −0.1 and −0.005, and b is between −200 and 100, but is more preferably negative and between −100 and 0.

The values of the correction factor are preferably further limited by boundaries in order to induce an acceptable correction regardless of the indicator value. To do so, the values are restricted to a range comprise between a lower boundary and a higher boundary:

Factor($n$)=min(max($a$×Indic($n$)+$b$,lower boundary), higher boundary)

In order to give an example, when the correction factor is applied linearly, the correction factor can be comprised between 0.1 and 3. Therefore in this case, the lower boundary is preferably higher or equal to 0.1 and the higher boundary is lower or equal to 3. Also, the lower boundary is preferably lower or equal to 0.5 and the higher boundary is higher or equal to 1. If the computation of the correction factor before application of the boundaries are made in decibels, the values of the boundaries would of course be different.

The correction factor is computed for each segment of the input audio signal, which means that the correction factor varies permanently with the evolution of the spectral properties of the input audio content.

Figure 7:
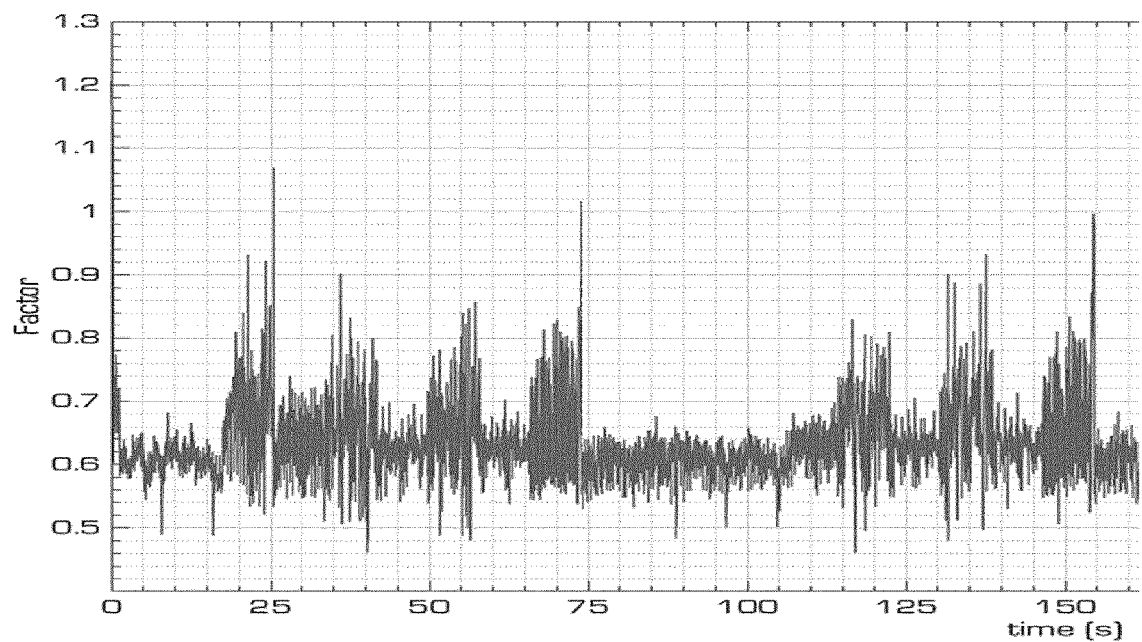
FIG. 7 shows an example of an evolution over time of a correction factor determined from an indicator representative of masking frequencies energy for an audio content immune to vibration.

FIG. 7 shows an example of an evolution over time of a correction factor determined from an indicator representative of masking frequencies energy for an audio content immune to vibration artefact. The audio content is here an excerpt of a hit song of electropop-music released in 2009. As in the example of FIG. 4, this piece of music has high acoustic levels in the high frequencies 31. The indicator is therefore high, and the correction factor is consequently low. The correction factor is nearly all of the time below 1, and mostly oscillates between 0.5 and 0.8.

Figure 8:
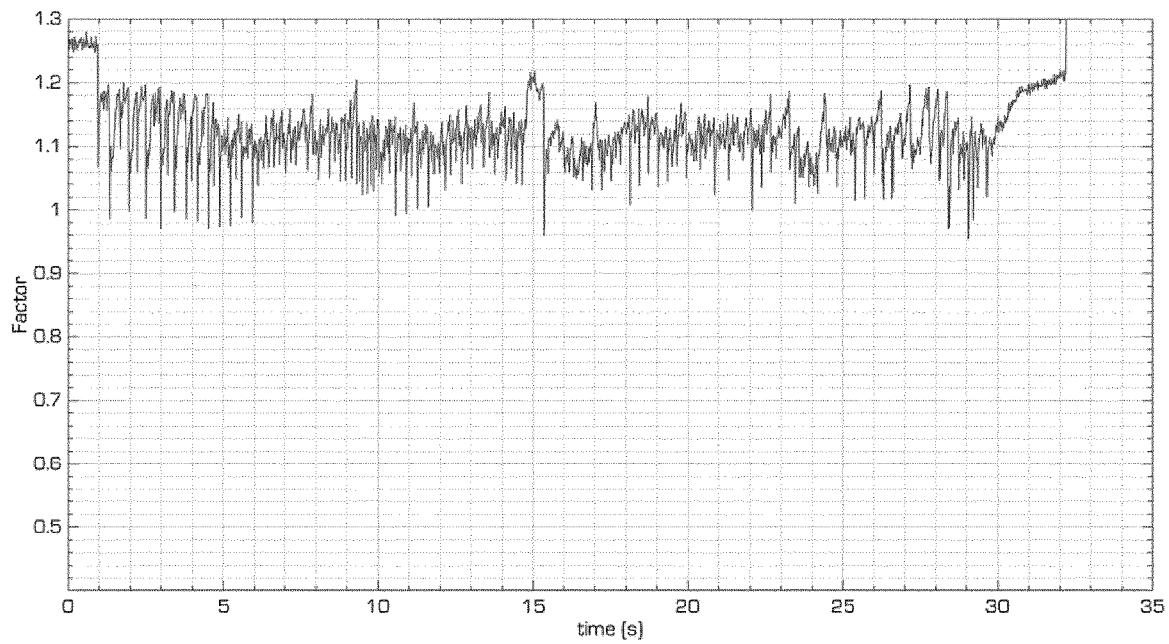
FIG. 8 shows an example of an evolution over time of a correction factor determined from an indicator representative of masking frequencies energy for an audio content polluted by vibration.

FIG. 8 shows an example of an evolution over time of a correction factor determined from an indicator representative of masking frequencies energy for an audio content prone to vibration artefact. The audio content is here an excerpt of a piece of classical music where artefacts are audible. As in the example of FIG. 5, this piece of music has low acoustic levels in the high frequencies 31. The indicator is therefore low, and the correction factor is consequently high, the correction factor is nearly all of the time above 1, and mostly oscillates between 1 and 1.2.

First Acoustic Level Thresholds

The correction factor is used to correct first acoustic level thresholds, which are independent from the content of the input audio signal. A predetermined set of first acoustic level thresholds for each of a plurality of frequency bands is available. The first acoustic level thresholds are hardware-related, i.e. they depend on the apparatus, and are independent from any audio content. As already explained above, artefacts such as vibration, distortion or buzzing usually occur when specific vibrating frequencies are played, regardless of the audio content. Artefacts may be present at frequencies that are very different from the vibrating frequency.

As shown on FIGS. 3 and 4, playing a pure sound at a vibrating frequency (880 Hz here) generates artefacts such as distortions. In addition to the peak 36 corresponding to the fundamental frequency at 880 Hz, the spectrum also shows that harmonics 37 and other artefacts also appear especially for the high frequencies 31, resulting from the vibrations and other distortions induced by the sound at the vibrating frequency being played by the apparatus. The appearance of the artefacts depends also on the loudness of the sound being played at the vibrating frequency for a given device. The higher the loudness is, the stronger the artefacts are.

The first acoustic level threshold of each frequency band indicates the highest acoustic level for that frequency band which can be played by the apparatus without significant artefacts like vibrations. The predetermined first acoustic level threshold associated to a frequency band corresponds to an acoustic level of a frequency band component at an excitation frequency corresponding to said frequency band that do not generate an estimated vibration acoustic level of sounds caused by the audio rendering device when excited with said frequency band component at the excitation frequency.

The first acoustic level thresholds can be determined by an automatic calibration process or by a manual calibration process (manual tuning). For each one of a plurality of frequencies, a pure tone (sine wave) is played by the audio rendering device. For the manual tuning, an operator listens to the rendered audio, and by varying the acoustic level, determines the corresponding first acoustic level threshold below which the vibrations and distortions are not audible. The operator can also listen to some problematic contents, and can identify the problematic frequency for each heard vibration with a spectrum analyzer. By varying the acoustic level of said problematic frequency with for instance the use of an equalizer, the first acoustic level threshold below which the vibrations and distortions are not audible can be determined.

In the automatic calibration process, the excitation audio signal is played on the loudspeaker of the apparatus, and the resulting sound is recorded by a microphone. The excitation audio signal comprises stimuli that are intended to reveal the frequency-related behavior of the apparatus. Typically, the excitation audio signal comprises a series of stimuli consisting in frequency band components at a plurality of excitation frequencies and with varying acoustic levels. More specifically, the stimuli are isolated pure sinusoidal sounds at a number of excitation frequencies (i.e. tones). The series of stimuli allows identifying the device's vibration for each excitation frequency. The excitation audio signal therefore aims at identifying the frequencies and the acoustic levels above which vibrations appear. The stimuli can be arranged in various way within the excitation audio signal. For example, it is possible to choose a sweep tone, i.e. a tone that changes linearly in frequency for example between 10 Hz to 20 kHz.

It is possible to use a succession of fixed frequency tone with varying acoustic levels. The excitation audio signal may comprise a plurality of time-isolated frequency band components with a time varying acoustic level.

A choice regarding the excitation frequencies to be tested has to be made. For example, frequencies corresponding to common musical notes can be chosen. The tested range can typically extend between 50 Hz and 20 kHz.

Figure 9:
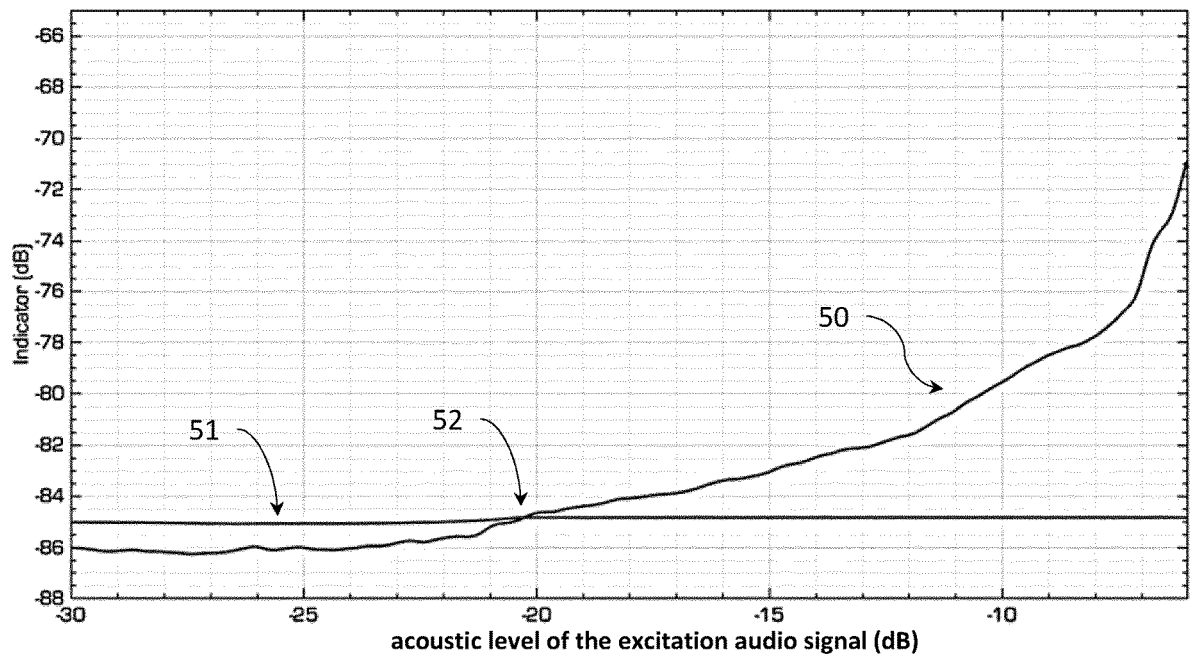
FIG. 9 shows an example of an evolution of an indicator representative of masking frequencies energy as a function of the acoustic level of a test audio signal, and the first acoustic level threshold derived therefrom.

The sound rendered by the audio rendering device when playing the excitation audio signal is recorded, and an indicator representative of masking frequencies energy is built therefrom for each excitation frequency, varying with the acoustic level of the stimulus. The indicator can be built as explained above. In FIG. 9, the curve 50 shows an example of an evolution of such an indicator as a function of the acoustic level of the excitation audio signal. The indicator's values have been smoothed to facilitate the demonstration, with a smoothing constant of a few seconds. The indicator increases with the acoustic level of the excitation audio signal, and the vibrations need a certain acoustic level to appear.

The indicator is then compared to a calibration threshold which corresponds to a mean value of the indicator (with a margin) when no vibration occurs. The value of the calibration threshold is represented by a line 51 in FIG. 9. In the depicted example, the calibration threshold is −85 dB (the value of course depends on the way the indicator is computed). Where the acoustic level of the excitation audio signal is low, i.e. below about −20 dB, the indicator's values are below the calibration threshold of −85 dB, which means that no noticeable vibrations occur. Where the acoustic level of the excitation audio signal is high, i.e. above about −20 dB, the indicator's values are above the calibration threshold of −85 dB, which means noticeable vibrations start to occur. The point 52 where the curve 50 of the indicator's value meets the line 51 of the calibration threshold gives the value of the first acoustic level threshold for the excitation frequency, −20 dB in the depicted example. By carrying on the same process for each excitation frequency, a preliminary first threshold can be associated with each excitation frequency.

Figure 10:
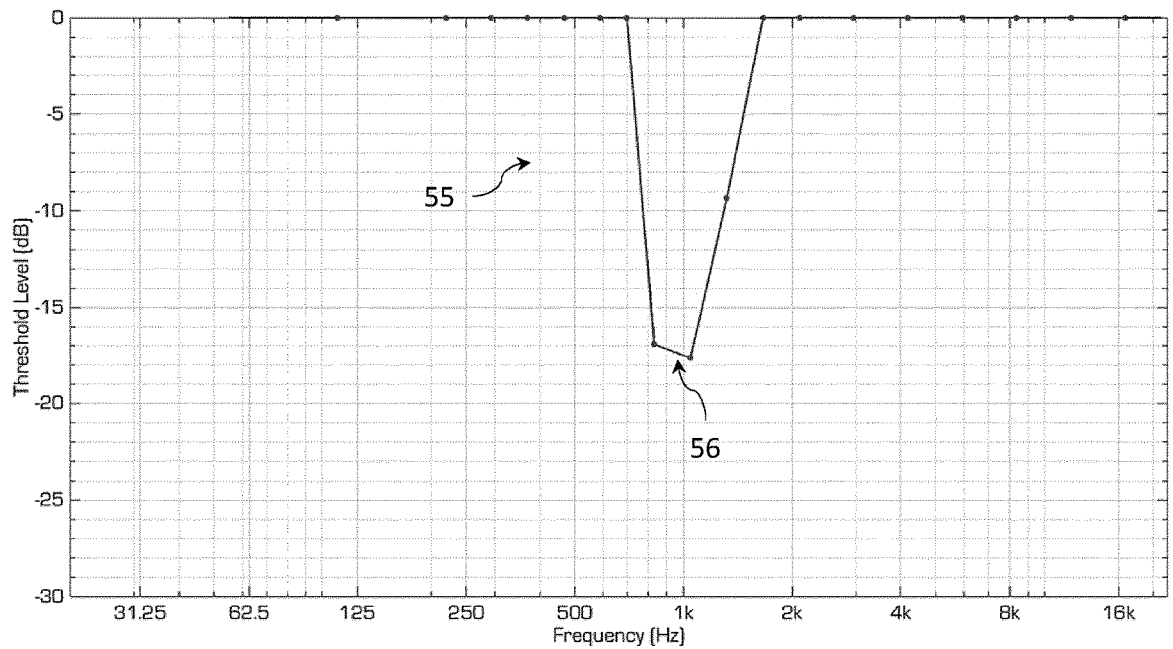
FIG. 10 shows an example of first acoustic level thresholds resulting from the calibration process.

FIG. 10 shows an example of a set of first acoustic level thresholds determined for a plurality of excitation frequencies corresponding to the frequencies of the frequency bins, and resulting from a calibration process. The curve 55 is mainly flat below 700 Hz and above 1700 Hz, where the values of the first acoustic level thresholds are 0 dB and comprises a negative peak 56 between 700 Hz and 1700 Hz, where the values of the first acoustic level thresholds are significantly lower than zero, and even go below −17 dB. This indicates that the tested device is sensitive to frequencies comprised roughly between 700 Hz and 1700 Hz, and consequently that content which acoustic levels within those frequencies may induce vibrations. Oppositely, for frequencies below 700 Hz and above 1700 Hz, the tested device will not experience audible vibrations.

Second Acoustic Level Thresholds

The correction factor is used to correct the first acoustic level thresholds, to obtain second acoustic level thresholds. As the first acoustic level thresholds, the second acoustic level threshold define a highest acoustic level for each frequency band that can be played without vibrations or artefacts, but this time by also taking into account the content of the input audio signal. The first acoustic level thresholds are independent from the content of the input audio signal, but the correction factor depends from the input audio signal. The second acoustic level thresholds resulting from the correction also depend on the input audio signal, through the correction factor, and are hardware-related, through the first acoustic level thresholds.

A second acoustic level threshold is determined (step S20) for each frequency band, by modifying (step S17) with the correction factor the first acoustic level threshold associated with said frequency band. The correction factor is applied to the first acoustic level thresholds, for instance by multiplying the first acoustic level thresholds with the correction factor (in a linear approach):

Second threshold$(n,k,c)$=Factor$(n)$×first threshold$(k,c)$ with n the buffer index, k the frequency band index, and c the channel index.

The correction factor can also be applied as an exponent on the first acoustic level threshold:

Second threshold$(n,k,c)$=first threshold$(k,c)^{Factor(n)}$

Preferably, for the frequencies within the range used for determining the indicator representative of masking frequencies energy (e.g. masking frequencies higher than the frequency threshold, typically higher than 6 kHz, 8 kHz, or 10 kHz), the correction factor is set to 1, and the second acoustic level thresholds is equal to the first acoustic level thresholds. It is indeed preferable not to introduce a bias by applying a correction factor on the very frequency components that were used to define the correction factor.

The second acoustic level thresholds correspond to the highest acoustic levels for which the artefacts due to the vibrations are not audible, because either:

the vibration-induced sounds are concealed by the audio content, or no vibration occurred.

It is possible to determine the second acoustic level thresholds only for frequencies below the frequency threshold (e.g. 8 kHz or 10 kHz), since the value of the first acoustic level threshold can be used for the masking frequencies.

Comparison

In a comparison step, the acoustic level of each frequency band component is compared (Step S30) to the second acoustic level threshold, and a gain is determined therefrom. Preferably, the comparison is carried on independently for each channel c. The acoustic level of a frequency band component can be the acoustic level of an estimate of the audio output $S_{out}$ that takes into account the device frequency response of the apparatus, or the normalized acoustic level $\tilde{S}(n, k, c)$, or the raw acoustic level of the frequency band component.

The gain can be determined as a ratio between the second acoustic level threshold and an acoustic level of the frequency band component, and for example:

$$\text{Gain } (n, k, c) = \frac{\text{second threshold } (n, k, c)}{|\tilde{S}(n, k, c)|}$$

with n the buffer index, f the frequency, and c the channel index. The determined gains can be regrouped into a gain vector.

Correction

One the gain has been determined for each frequency band component, a correction is performed, wherein the gain is applied to the frequency band components (Step S40). There are several possible ways to apply the correction. A gain vector can be directly applied to the acoustic level of each frequency band component, typically through frequency masking. It is also possible to apply a peak filter (in time or frequency).

Figure 11:
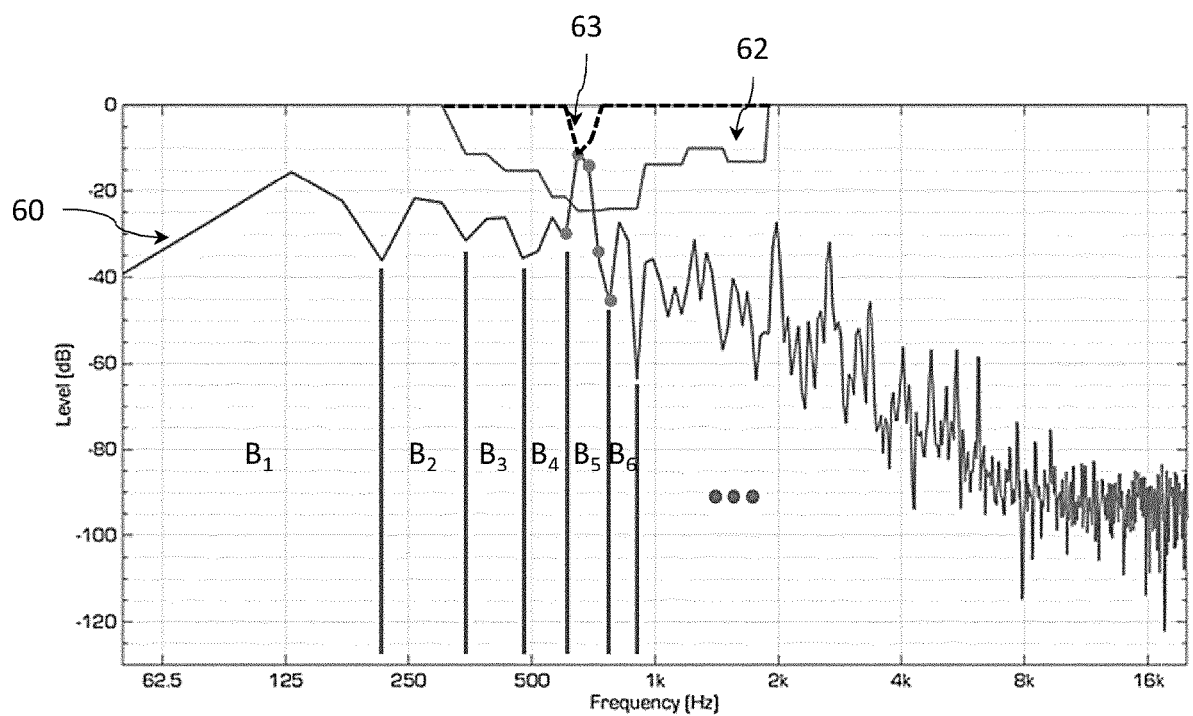
FIG. 11 shows an example of a grouping of a spectrum of an audio content and the corresponding adaptive threshold in a multiband post-processing according to a possible embodiment of the invention.

In order to improve the results of the correction, and especially to reduce the effects of processing artefacts, it is preferable to post-process the reduction gains that will be applied. For each channel, the local minima of the frequency band components of the input audio signal are determined. Frequency bands (e.g. frequency bins) between two successive local minima are grouped into frequency groupings $B_i$. Grouping the frequency bands can be done based on the central frequency of each frequency band. On FIG. 11, the first (i.e. of lower frequencies) six groupings $B_1$, $B_2$, $B_3$, $B_4$, $B_5$, $B_6$ are shown, but other groupings $B_i$ of higher frequencies exits, but are too closed to each other to be legibly shown. The six groupings $B_1$, $B_2$, $B_3$, $B_4$, $B_5$, $B_6$ are defined between local minima of the spectrum 60 of the input audio signal. For example, five frequency bins are grouped into the fifth grouping $B_5$. They are depicted through five small circles on the spectrum 60. FIG. 11 also shows the second acoustic level thresholds 62 for each frequency bands. FIG. 11 also shows the values of the reduction gains 63 (dashed line) for each frequency bands, resulting from the difference between the second acoustic level threshold and an acoustic level of the frequency band component for each frequency band, i.e. the values of the spectrum 60.

Then, for each grouping $B_i$, the lowest corresponding reduction gain is determined among the reduction gains that are associated with the frequency bands of the grouping $B_i$.

This lowest reduction gain is then associated to all the frequency bands of the grouping $B_i$.

$$\text{Gain}(n, B_i, c) = \min_{j \in B_i}(\text{Gain}(n, j, c))$$

wherein n is the buffer index, $B_i$ the grouping of frequency bands, and c the channel.

In the example of FIG. 11, the five frequency bins of the fifth grouping $B_5$ are associated with reduction gains of 0, −10, −8, 0 and 0, respectively. Indeed, only two frequency bins have amplitudes above the second acoustic level thresholds, and therefore are associated with non-zero reduction gains. As a result, the five frequency bins of the fifth grouping $B_5$ are now associated with a common reduction gain of −10 dB.

Optionally, the reduction gains can be smoothed by filtering at every frequency bands using recursive, median or mean filter potentially with asymmetric behaviour. For example, the frequency mask can be smoothed before application, in order to avoid gain pumping and/or distortion effects. A first-order low-pass filter can be used, with a very small or null attack, and a release time for example ranging from 100 ms to 300 ms. The filtering involves the reduction gain for the current buffer and the reduction gain of the previous buffer. For example, the low-pass filter can be:

$$\text{Gain}(n,k,c) = (1-\alpha)*\text{Gain}(n-1,k,c) + \alpha*\text{Gain}_{theoretical}(n,k,c)$$

wherein n is the buffer index, k is the frequency bin index, c is the channel index, a is an adjusting parameter that defines the release, and $\text{Gain}_{theoretical}$ is the reduction gain that would be obtained without smoothing.

Once the reduction gains have been applied to the acoustic level of the frequency band components, the different corrected frequency band components can be converted (step S50) into an output audio signal, for example into the time-domain by using an inverse FFT if an FFT was used for extracting the plurality of frequency band components from the input audio signal. The output audio signal is then rendered (step S60) by the audio rendering device: the sound is played by the apparatus.

If the received input audio signal is a multi-channel input audio signal, each channel of the multi-channel input audio signal being assigned to a respective audio rendering device such as a loudspeaker, various approaches can be adopted. The entire method can be duplicated independently for each channel, each channel having its own audio input signal, device frequency response and first acoustic level thresholds. The resulting output audio signal associated with a channel is then played by the audio rendering device associated to said channel.

It is also possible to only partially duplicate between channels the processing of a multi-channel input audio signal. This can be especially useful for implementing spatial effects such as 3D spatialization effects, transaural or binaural. It is for example possible to apply the same correction for several channels, typically the right and left channels. To do so, the lowest reduction gains between the channels are selected. It is also possible to first determine preliminary reduction gains for each channel, and then to determine the reduction gain for each extracted frequency band of a channel through a weighted average between the preliminary reduction gain of said channel and a minimal preliminary reduction gain among preliminary reduction gains of various channels. The weighting may be controlled by a control parameter, for example comprised between 0 and 1, to adjust how far the different channels are combined.

A plurality of indicators representative of masking frequencies energy can be determined for a same input audio signal. Different frequency thresholds can be used, typically a different frequency threshold for each indicator. More specifically, several subranges can be defined within the frequency spectrum of the input audio signal, and a different indicator representative of masking frequencies energy can be determined from frequency bands of different frequency subranges. The frequency range of the input audio signal can be divided into subranges in accordance with different partitioning patterns defining a first subrange and a second subrange, the second subrange being defined by a frequency threshold as a lower boundary. The first subrange determines the frequency bands with which an indicator representative of masking frequencies energy is associated, and the second subrange determines the frequency bands from which said indicator representative of masking frequencies energy is determined. The first subrange encompasses frequency bands with lower frequencies than those of the second subrange. This is especially useful when an exciting frequency causes vibration at multiple frequency subranges or two exciting frequencies cause vibrations at for instance two different frequency subranges. The dividing of the frequency range does not need to be total, and some frequency bands may not be part of either the first subrange or the second subrange. Also, a subrange is not necessarily continuous. For example, a first subrange can extend from 200 Hz to 600 Hz and from 1000 to 4000 Hz.

As an example, a first partitioning pattern can consist in dividing a frequency range of 0-20 kHz into a first subrange 0-8 kHz and a second subrange 8 kHz-20 kHz, based on a first frequency threshold at 8 kHz. A first indicator representative of masking frequencies energy is determined from frequency bands within the second subrange 8 kHz-20 kHz, i.e. above the first frequency threshold at 8 kHz, and is associated with the frequency bands within the first subrange 0-8 kHz. A second partitioning pattern can consist in dividing the frequency range of 0-20 kHz into a first subrange of 8 kHz-12 kHz and a second subrange 12 kHz-20 kHz. The selected first subrange is a part of the possible first subrange (0-12 kHz). A second indicator representative of masking frequencies energy is determined from frequency bands within the second subrange 12 kHz-20 kHz, i.e. above a second frequency threshold at 12 kHz, and is associated with the frequency bands within the first subrange 8 kHz-12 kHz.

The partitioning patterns are determined beforehand, for example based on a previously measured behaviour of the loudspeakers during a calibration process. The correction factor associated with a frequency band is determined from at least one of the plurality of indicators representative of masking frequencies energy associated with said frequency band.

Some indicators may not be used. Preferably, a correction factor is determined from each indicator representative of masking frequencies energy, resulting in a plurality of correction factors associated with frequency bands of said subrange of frequencies.

In the example above, there is no overlap between the two first subranges, and therefore each frequency band is associated with only one indicator representative of masking frequencies energy, even though it is not the same indicator for frequency bands within the subrange 0-8 kHz and frequency bands within the subrange 8 kHz-12 kHz. As a result, when a correction factor is determined from each indicator representative of masking frequencies energy, a first correction factor is associated with frequency bands within the subrange 0-8 kHz and a second correction factor is associated with frequency bands within the subrange 8 kHz-12 kHz.

The correction factor associated with a frequency band is used to determine a reduction gain for that frequency band. If an excitation frequency band component is reduced through the use of a correction factor and if this frequency band is in the second frequency subrange of another indicator (which determines the frequency bands from which said other indicator is determined), then this other indicator must be calculated after application of the potential reduction gain of the excitation frequency band. Using the previous example, where the first indicator is determined from frequency bands between 8 kHz and 20 kHz and the second indicator is determined from frequency bands between 12 kHz and 20 kHz, and is used for frequency bands between 8 kHz and 12 kHz. The second reduction gain is first calculated and applied to all frequency bands between 8 kHz and 12 kHz, before calculating the first indicator based on frequency bands between 8 kHz and 20 kHz.

The partitioning patterns can also result in overlapping subranges, resulting in a frequency band being associated with several indicators. For example, in addition to the first and second partitioning patterns in the example above, a third partitioning patterns can consist in dividing the frequency range into a first subrange 0-9 kHz and a second subrange 10 kHz-20 kHz, based on a third frequency threshold at 10 kHz. A third indicator representative of masking frequencies energy can be determined from frequency bands within the second subrange 10 kHz-20 kHz, i.e. above the third frequency threshold at 10 kHz, and is associated with the frequency bands within the first subrange 0-9 kHz. As a result, frequency bands between 0-8 kHz are associated with the first indicator and the third indicator, frequency bands between 8 kHz and 9 kHz are associated with the second indicator and the third indicator, and frequency bands between 9 kHz and 12 kHz are associated with the second indicator. It is possible to determine only one correction factor for a frequency band associated with several indicators by selecting one of the indicators for determining a correction factor. For example, a correction factor for a frequency band of index k can be determined by the following formula:

$$\text{Factor}(n,k) = a \ast \max(\text{Indic}_1(n,k), \text{Indic}_2(n,k)) + b$$

where $\text{Indic}_1(n, k)$ and $\text{Indic}_2(n, k)$ are two indicators representative of masking frequencies energy associated with the frequency band of index k.

It is also possible to determine a correction factor for each indicator representative of masking frequencies energy and then to select one of them to compute the second acoustic threshold. Following the example above, a third correction factor is determined and associated with the frequency bands within the subrange 0-9 kHz. As a result, frequency bands between 0-8 kHz are associated with the first correction factor and the third correction factor, frequency bands between 8 kHz and 9 kHz are associated with the second correction factor and the third correction factor, and frequency bands between 9 kHz and 12 kHz are associated with the second correction factor. It should be noted that for frequency bands above 12 kHz, the correction factor is considered equal to 1 and thus does not need to calculated. The first acoustic level threshold will be used to determine the reduction gain.

Only one second acoustic level threshold is to be used for determining the reduction gain applied to a frequency band. It is possible to determine beforehand which indicator representative of masking frequencies energy will be used, for example based on the respective values of the indicators. Otherwise, a correction factor is selected among the plurality of correction factors associated with said frequency band. Preferably, the selected correction factor among the predetermined plurality of correction factors is selected for resulting in a lowest second acoustic level threshold among second acoustic level thresholds that would be determined by using the plurality of correction factors. In the example above, for a given frequency band below 8 kHz, if the first correction factor results in a second acoustic level threshold of −10 dB and the third correction factor results in a second acoustic level threshold of −20 dB, then the third correction factor is to be the selected correction factor, and the second acoustic level threshold will be −20 dB. Typically, the selection is performed on the correction factors' values.

While the present invention has been described with respect to certain preferred embodiments, it is obvious that it is in no way limited thereto and it comprises all the technical equivalents of the means described and their combinations. In particular, it will be apparent to those skilled in the art that various changes and modifications may be made without departing from the scope of the invention as defined in the appended claims.

The invention claimed is:

1. A method for audio rendering by an apparatus comprising at least one audio rendering device, the method comprising:
   a) receiving an input audio signal,
   b) extracting a plurality of frequency band components from the input audio signal, each frequency band components having an acoustic level associated with a frequency band,
   c) determining from the plurality of extracted frequency band components at least one indicator representative of masking frequencies energy, masking frequencies corresponding to frequency bands that are above a frequency threshold, the indicator representative of masking frequencies energy being determined only from frequency bands that are above the frequency threshold,
   d) determining at least one correction factor from at least one indicator representative of masking frequencies energy,
   e) for each frequency band, determining a second acoustic level threshold by modifying with the at least one correction factor a predetermined first acoustic level threshold associated with said frequency band, wherein the first acoustic level threshold is independent from the content of the input audio signal, said first acoustic level threshold indicating a highest acoustic level for that frequency band which can be played by the apparatus without significant artefacts, and wherein the second acoustic level thresholds depend on the input audio signal,
   f) for each frequency band, determining a reduction gain from a comparison between an acoustic level of the extracted frequency band component of said frequency band and the second acoustic level threshold associated with said frequency band, and
   g) applying the reduction gain to the acoustic levels of the frequency band components,
   h) converting the different frequency band components into an output audio signal
   i) audio rendering the output audio signal by the audio rendering device.

2. The method of claim 1, wherein the audio rendering device has a predetermined device frequency response, and the indicator representative of masking frequencies energy is also determined from the device frequency response.

3. The method of claim 1, wherein the frequency threshold is higher or equal to 6 kHz.

4. The method of claim 1, wherein a plurality of indicators representative of masking frequencies energy are determined, the indicators representative of masking frequencies energy being determined from frequency bands corresponding to different subranges of frequencies defined by different frequency thresholds.

5. The method of claim 4, wherein several correction factors are determined from the plurality of indicators representative of masking frequencies energy, and different correction factors are used to determine second acoustic level thresholds of different frequency bands, the correction factor that is used depending on the frequency band.

6. The method of claim 5, wherein the frequency band components are extracted as frequency band signal components, and the acoustic level of a frequency band signal component is an amplitude of the frequency band signal component.

7. The method of claim 4, wherein at least one frequency band is associated to several indicators representative of masking frequencies energy, and the correction factor used to determine the second acoustic level threshold associated with said frequency band is determined from at least one of the several indicators representative of masking frequencies energy associated with said frequency band.

8. The method of claim 1, wherein the indicator representative of masking frequencies energy determined in step c) is a function of a sum of acoustic levels of frequency band components that are above the frequency threshold, or is a function of statistical property of the spectrum such as the variance.

9. The method of claim 1, wherein the higher the masking frequencies energy in the input audio signal is, the lower the correction factor is, and conversely the lower the masking frequencies energy in the input audio signal is, the higher the correction factor is.

10. The method of claim 1, wherein each first acoustic level threshold is comprised between 0 and −60 dB, and results from an automatic calibration process or a manual calibration process before receiving the input audio signal.

11. The method of claim 1, wherein the input audio signal is a multi-channel input audio signal, each channel associated with an audio rendering device, and at least the steps b) to e) are performed independently for each channel.

12. The method of claim 1, wherein the frequency band components are extracted as frequency band bin components, and each frequency band is a frequency bin, and wherein step g) comprises:
  g1) for each frequency band, determining a preliminary gain from a comparison between an acoustic level of the extracted frequency band component of said frequency band and the second acoustic level threshold associated with said frequency band,
  g2) detecting a plurality of local minima over acoustic levels of frequencies in the frequency band components,
  g3) grouping together frequency bands located between two local minima to form a plurality of frequency groupings,
  g4) for each grouping, determining a reduction gain of the grouping corresponding to a lowest preliminary gain among the preliminary gains of the frequency bands of said grouping,
  g5) affecting the reduction gain of the grouping to each one extracted frequency bands of said grouping.

13. The method of claim 1, wherein a microphone records a microphone signal in the vicinity of the apparatus when the output audio signal is rendered by the audio rendering device, and the microphone signal is used to modify the indicator as a function of a part of the microphone signal corresponding to ambient sound in the vicinity of the apparatus.

14. Apparatus comprising at least one audio rendering device and a processing unit, the apparatus being configured to perform the steps of the method according to claim 1.

15. Non-transitory computer-readable medium comprising program instructions stored thereon that cause the computer to perform the steps of the method according to claim 1 when read by a computer.

16. The method of claim 1, wherein the frequency band components are extracted as frequency band bin components, and each frequency band is a frequency bin, and wherein step b) comprises converting the input audio signal into frequency band bin components in a frequency domain, wherein the acoustic level of a frequency band bin component is a magnitude of a frequency band bin component, and wherein step h) comprises converting frequency band bin components into a time domain.

* * * * *